(12) United States Patent
Keil et al.

(10) Patent No.: US 9,438,256 B2
(45) Date of Patent: Sep. 6, 2016

(54) SLOW TO FAST CLOCK SYNCHRONIZATION

(71) Applicant: Apple Inc., Cupertino, CA (US)

(72) Inventors: Shane J. Keil, San Jose, CA (US); Gilbert H. Herbeck, Livermore, CA (US)

(73) Assignee: Apple Inc., Cupertino, CA (US)

( * ) Notice: Subject to any disclaimer, the term of this patent is extended or adjusted under 35 U.S.C. 154(b) by 55 days.

(21) Appl. No.: 14/478,387

(22) Filed: Sep. 5, 2014

(65) Prior Publication Data

US 2015/0349787 A1    Dec. 3, 2015

Related U.S. Application Data

(60) Provisional application No. 62/007,158, filed on Jun. 3, 2014.

(51) Int. Cl.
| | |
|---|---|
| *H03L 7/00* | (2006.01) |
| *H03L 7/091* | (2006.01) |
| *H03K 5/1534* | (2006.01) |

(52) U.S. Cl.
CPC ............. *H03L 7/091* (2013.01); *H03K 5/1534* (2013.01)

(58) Field of Classification Search
CPC ....................................................... H03L 7/091
See application file for complete search history.

(56) References Cited

U.S. PATENT DOCUMENTS

| | | | |
|---|---|---|---|
| 6,359,479 | B1 | 3/2002 | Oprescu |
| 6,366,991 | B1 | 4/2002 | Manning |
| 6,744,285 | B2 | 6/2004 | Mangum et al. |
| 6,988,215 | B2 | 1/2006 | Splett et al. |
| 7,180,332 | B2 * | 2/2007 | Di Gregorio ......... H04L 7/0012 326/93 |

* cited by examiner

*Primary Examiner* — Daniel Puentes
(74) *Attorney, Agent, or Firm* — Meyertons, Hood, Kivlin, Kowert & Goetzel, P.C.

(57) ABSTRACT

A method and apparatus for synchronizing data transfers from a first clock domain to a second clock domain includes sampling data from circuit included in the first clock domain. The clock signal from the first clock domain may then be synchronized to a clock signal from the second clock domain. The sampled data may then be captured using the clock signal from the second clock domain responsive to a detection of an edge of the synchronized first clock signal.

16 Claims, 8 Drawing Sheets

SLOW TO FAST CLOCK SYNCHRONIZATION

The present application claims benefit of priority to U.S. Provisional Patent Application No. 62/007,158, entitled "SLOW TO FAST CLOCK SYNCHRONIZATION," filed Jun. 3, 2014.

BACKGROUND

1. Technical Field

This disclosure relates to integrated circuits employing multiple functional blocks at different clock frequencies, and in particular, to methods for synchronizing data transfers between such functional blocks.

2. Description of the Related Art

Computing systems may include one or more systems-on-a-chip (SoC), which may integrate a number of different functions, such as, e.g., graphics processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Within an SoC, different regions or functional blocks may operate at different clock frequencies (functional blocks operating at different clock frequencies are commonly referred to as being in different "clock domains"). For example, functional blocks coupled to external interfaces may operate at a clock frequency commensurate with the needs of such external interfaces, while other functional blocks may be designed to function at a highest clock frequency possible for a given semiconductor manufacturing process. Other functional blocks may include logic circuits operating at different clock frequencies, while some functional blocks may also allow for varying clock frequencies over time dependent upon work load.

In some cases, it may be necessary to transfer data from a functional block operating at one clock frequency to a functional block operating at a different clock frequency. When transferring data from one clock domain to another, errors may arise as the data is captured at the receiving functional block. To mitigate such errors, synchronization units may be employed to ensure that data at the receiving end is properly sampled and captured.

SUMMARY OF THE EMBODIMENTS

Various embodiments of a method and apparatus for synchronizing data that is transferred from one clock domain to another are disclosed. Broadly speaking, a method and system are contemplated in which a first flip-flop circuit is configured to sample data dependent upon a first clock signal. A synchronizer circuit may be configured to synchronize the first clock signal to a second clock signal, and an edge detection circuit may be configured to detect an edge of the first clock signal. In response to the detection of the edge of the first clock signal, a second flip-flop circuit may be configured to capture the sampled data dependent upon the second clock signal.

In one embodiment, a frequency of the first clock signal is lower than a frequency of the second clock signal. In a further embodiment, the first flip-flop circuit is a D-type flip-flop circuit.

In another non-limiting embodiment, the synchronizer circuit includes a third flip-flop circuit and a fourth flip-flop circuit. The third flip-flop circuit may be configured to sample the first clock signal dependent upon the second clock signal, and the fourth flip-flop circuit may be configured to sample an output of the third flip-flop circuit dependent upon the second clock signal.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF THE EMBODIMENTS

Different functional blocks within a System-on-a-Chip (SoC) or other computing system may operate using clock signals of differing frequencies. When data is sent from a functional block operating at one frequency to a functional block operating at a different frequency, attempts to capture (or "latch") data at the receiving functional block may be problematic as the data being received may be asynchronous to the clock signal of the receiving functional block. In such cases, latches or flip-flops, may enter metastable states, i.e., a state that is neither of the states of a normal bistable circuit, resulting in erroneous logic values.

Multiple flip-flops circuits in series may be used to capture data at a receiving functional block. The use of such techniques, however, may only be suitable for individual data bits, and may present difficulties when applied to an entire data bus. Due to various effects, such as, e.g., skew among individual data bits of a bus, different data bits of a data bus may arrive in the destination clock domain as much as one clock cycle later. Complex solutions may be employed to perform data bus synchronization, however, such solutions may result in reduced system performance. The embodiments illustrated in the drawings and described below may provide techniques for synchronizing data transfers across entire data busses between functional blocks, while maintaining desired performance levels.

System-on-a-Chip Overview

Figure 1:
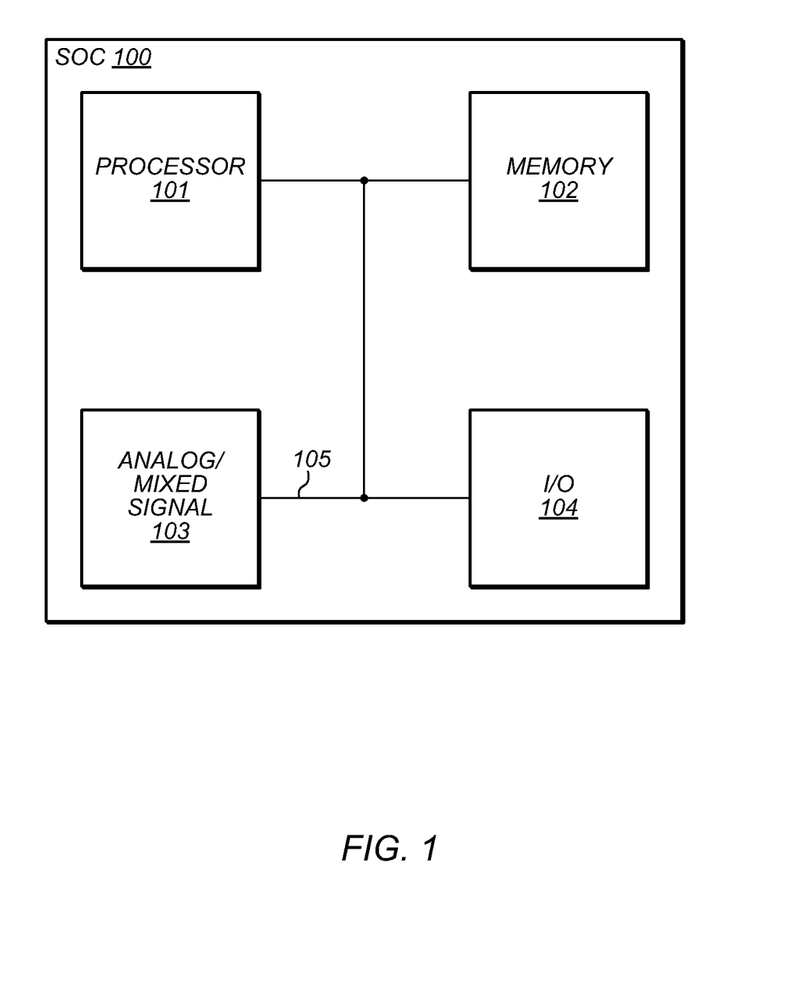
FIG. 1 is a block diagram of an embodiment of a System-on-a-chip (SoC).

A block diagram of an System-on-a-Chip (SoC) is illustrated in FIG. 1. In the illustrated embodiment, SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular or mobile telephone. Transactions on internal bus 105 may be encoded according to one of various communication protocols. For example, transactions may be encoded using Peripheral Component Interconnect Express (PCIe®), or any other suitable communication protocol.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH or other non-volatile memory, Phase Change Memory (PCM), or a Ferroelectric Random Access Memory (FeRAM), for example. It is noted that in the embodiment of an SoC illustrated in FIG. 1, a single memory block is depicted. In other embodiments, any suitable number of memory blocks may be employed.

As described in more detail below, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA).

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with cellular telephone networks, wireless local area networks (WLANs), or any other suitable network.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol or any other suitable communication protocol.

I/O block 104 may also be configured to coordinate data transfer between SoC 100 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Each of the functional blocks included in SoC 100 may be included in separate power and/or clock domains. In some embodiments, a functional block may be further divided into smaller power and/or clock domains. Each power and/or clock domain may, in some embodiments, be separately controlled thereby selectively deactivating (either by stopping a clock signal or disconnecting the power) individual functional blocks or portions thereof.

Synchronization Techniques

Figure 2:
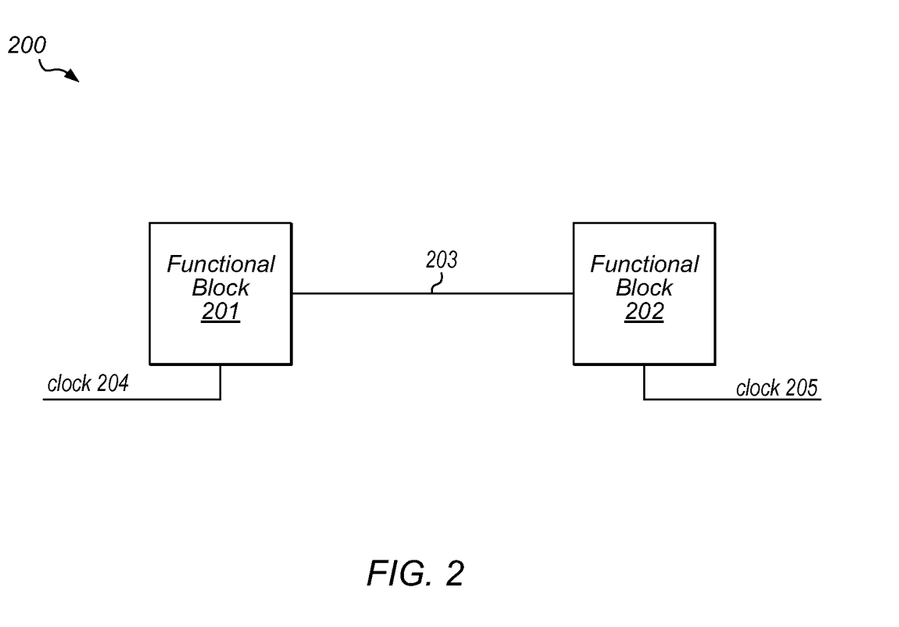
FIG. 2 is a block diagram of an embodiment of multiple functional blocks within an SoC.

Turning to FIG. 2, a block diagram of an embodiment of multiple functional blocks within an SoC is illustrated. The illustrated embodiment includes functional blocks 201 and 202 coupled by bus 203. Functional block 201 receives clock 204, and functional block 202 receives clock 205. In various embodiments, each of functional blocks 201 and 202 may correspond to any of processor 101, memory 102, analog/mixed signal block 103, or I/O block 104, or any other functional block of SoC 100 as illustrated in FIG. 1. Functional blocks 201 and 202 may, in other embodiments, be included as sub-blocks of one of the aforementioned blocks of SoC 100.

In some embodiments, a frequency of clock 204 may be higher than a frequency of clock 205, while, in other embodiments, the frequency of clock 204 may be lower than the frequency of clock 205. Each of clock 204 and clock 205 may, in various embodiments, be generated by a PLL, Delay-locked Loop (DLL), or any other suitable clock generation circuitry. Clocks 204 and 205 may, during the course of operation, be stopped in response to determining that a corresponding functional block's capabilities are not currently needed by the system. Although only a single functional block is shown coupled to each of clocks 204 and 205, in other embodiments, any number of functional blocks may be coupled to a given one of clocks 204 and 205. Functional blocks and/or logic circuits coupled to receive a particular clock signal are commonly referred to as being in the same clock domain.

Bus 203 may, in various embodiments, include multiple data lines by which data is transferred between functional block 201 and functional block 202. In some embodiments, bus 203 may be bi-directional, while, in other embodiments, bus 203 may be partitioned such that a portion of the bus is for data transfers from functional block 201 to functional block 202 and another portion of the bus is for data transfers from functional block 202 to functional block 201.

In addition to data lines, bus 203 may, in various embodiments, include request and acknowledgement signals (not shown) that allow for the two functional blocks to request a transfer of data, and then acknowledge that the data has been successfully transferred. In some embodiments, data to be transferred from functional block 201 to functional block 202, or vice-versa, may be encoded according to one of various algorithms, such as, e.g., Gray code, prior to transfer, etc.

During operation, when the frequencies of clock 204 and clock 205 are different, a receiving functional block may have difficulty sampling (or "capturing") data from bus 203 due to the differences in the frequencies of the clocks. In such cases, latches or flip-flops within the receiving functional block that are used to capture the data, may not be active for a correct period of time to properly capture the data, resulting in an error. As described below in more detail, a functional block, such as, e.g., functional block 201, may include a synchronization unit that allows for proper sampling of data within the receiving functional block.

It is noted that the embodiment illustrated in FIG. 2 is merely an example. In other embodiments, different numbers of functional blocks and different configurations of functional blocks may be employed.

Figure 3:
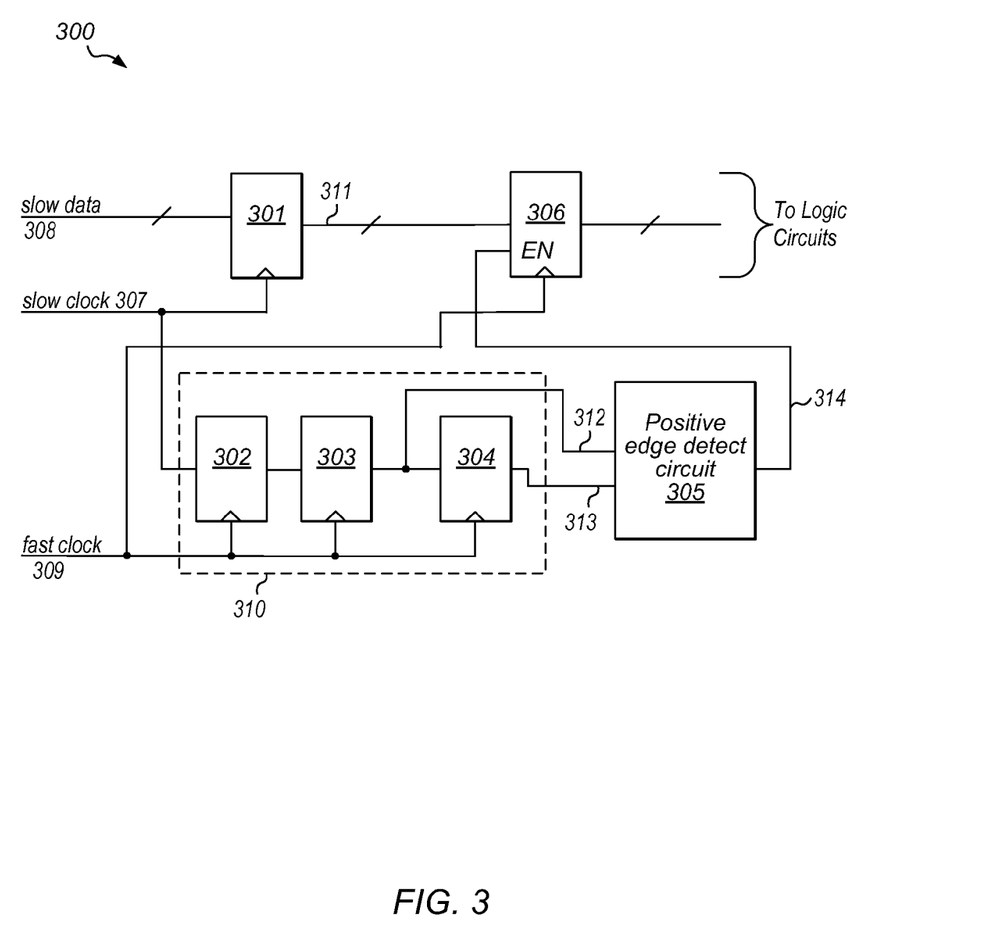
FIG. 3 is a block diagram of an embodiment of a synchronization unit.

An embodiment of a synchronization unit is illustrated in FIG. 3. In the illustrated embodiment, synchronization unit 300 includes flip-flop 301, positive edge detection circuit 305, flip-flop 306, and synchronizer circuit 310, which includes flip-flops 302, 303, and 304. It is noted that although synchronizer circuit 310 employs a depth of two flip-flops, in other embodiments, any suitable number of flip-flops may be employed depending upon such factors as clock frequencies, process technology, and the like. Synchronization unit 300 may, in various embodiments, be suitable for synchronizing data from a slow clock domain to a fast clock domain. Although flip-flops 301 and 306 are depicted in FIG. 3 as being single flip-flop circuits, in various other embodiments, flip-flops 301 and 306 may include any suitable number of flip-flop circuits each of which coupled to respective data bits of slow data bus 308 and sampled data bus 311.

Flip-flop 301 may be configured to sample (or "capture") slow data bus 308 responsive to slow clock 307 to generate sampled data bus 311. In various embodiments, flip-flop 301 may be an edge triggered flip-flop or any other suitable type of flip-flop circuit. As noted above, flip-flop 301 is depicted as a single flip-flop, in other embodiments, additional data bits may be sampled with the use of additional flip-flops configured in a similar fashion to flip-flop 301.

Flip-flops, such as those used and described herein, may be particular embodiments of a bistable multivibrator circuit that has two stable states that may be used to store information, and may be designed in accordance with one of various design styles. For example, a flip-flop may be a set-reset (SR-type) flip-flop, a data or delay (D-type) flip-flop, or another suitable flip-flop type.

Synchronizer circuit 310 may, in various embodiments, be configured to synchronize slow clock 307 to fast clock 309. As used and described herein, when a first signal is synchronized to a second signal, at least one transition (either low to high, or high to low) of a synchronized version of the first signal corresponds to a transition of the second signal. Flip-flop 302 is configured to receive slow clock 307, and sample slow clock 307 dependent upon fast clock 309. The output of flip-flop 302 may be subsequently captured by flip-flop 303 dependent upon fast clock 309 to generate synchronized slow clock signal 312. In a similar fashion, flip-flop 304 may capture synchronized slow clock signal 312 dependent upon fast clock 309 to generate synchronized slow clock signal 313. It is noted that although three flip-flop circuits coupled in series are depicted in synchronizer circuit 310, in various other embodiments, different numbers of flip-flop circuits may be employed. In some embodiments, the use of additional flip-flop circuits may improve the Mean Time Between Failure (MTBF) of synchronizer unit 300.

Positive edge detection circuit 305 may be configured to receive synchronized slow clock signals 312 and 313 from synchronizer circuit 310. Dependent upon the received signals 312 and 313, positive edge detection circuit 305 may generate enable signal 314 upon the detection of a positive edge (i.e., a low to high transition) of slow clock signal 307. In various embodiments, positive edge detection circuit 305 may employ a delay circuit to delay one of synchronized slow clock signals 312 and 313, and one or more logic gates to combine the delayed signal with one of synchronized slow clock signals 312 and 313. Although a positive edge detection circuit is depicted in synchronizer unit 300, in other embodiments, a negative edge detection scheme may be used.

Flip-flop 306 may be configured to capture sampled data 311 dependent upon fast clock 309 when enabled by enable signal 314 generated by positive edge detection circuit 305. The output of flip-flop 306 may, in various embodiments, be coupled to other logic circuits within a functional block employing fast clock 309.

It is noted that the embodiment depicted in FIG. 3 is merely an example. In other embodiments, different configurations of logic circuit elements are possible and contemplated.

Figure 4:
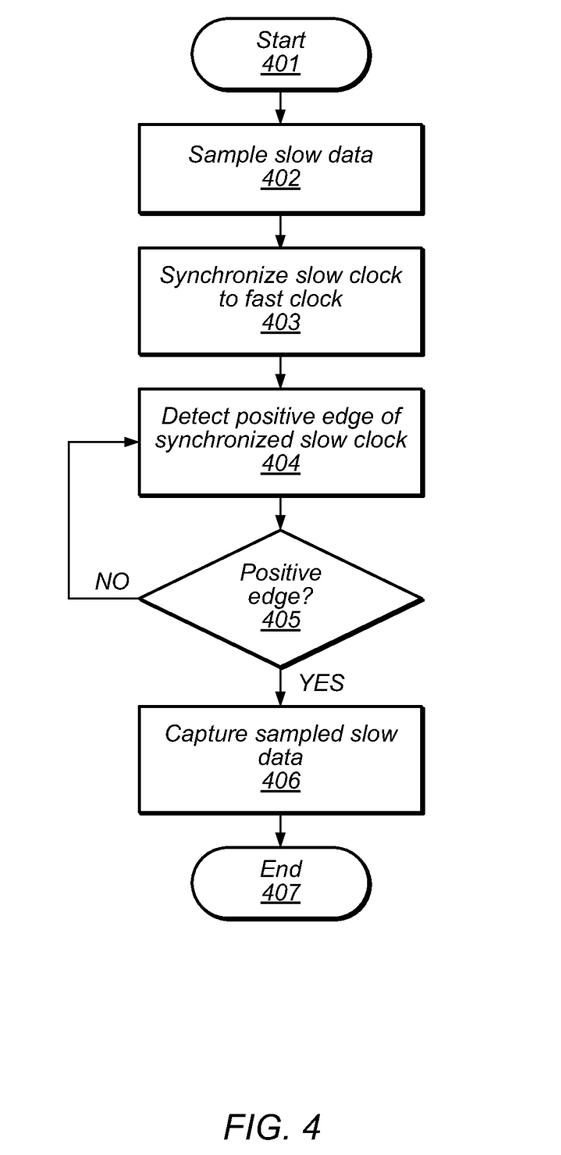
FIG. 4 illustrates a flow diagram of an embodiment of a method for synchronizing a data transfer between clock domains.

Turning to FIG. 4, a flowchart depicting an embodiment of a method for synchronizing data between two clock domains is illustrated. Referring collectively to synchronizer unit 300 as depicted in FIG. 3, and the flow diagram illustrated in FIG. 4, the method begins in block 401.

Flip-flop 301 may then sample slow data bus 308 to generate sampled data 311 (block 402). In various embodiments, slow data bus 308 may be sampled dependent upon slow clock 307. It is noted that although slow data bus 308 is depicted as a single data bit, any suitable number of data bits may be sampled and synchronized using this method.

Synchronizer circuit 310 may then synchronize slow clock 307 to fast clock 309 (block 403). Flip-flop circuits 302, 303, and 304 may be activated in parallel by fast clock 309 in order to synchronize slow clock 307 to fast clock 309 and generated synchronized slow clock signals 312 and 313. Although block 402 is depicted as being performed sequentially after block 401, in various embodiments, the operations included in blocks 401 and 402 may be performed in parallel.

Positive edge detection circuit 305 may then detect a positive edge of the synchronized slow clock (block 404). In various embodiments, positive edge detection circuit 305 may detect a positive edge of the synchronized slow clock dependent upon synchronized slow clock signals 312 and 313. Positive edge detection circuit 305 may employ delay circuits, or any other suitable circuits and techniques, to detect positive edges of the synchronized slow clock. Although detection of a positive edge is described in block 404 of the method illustrated in FIG. 4, in other embodiments, a negative edge of the synchronized slow clock may also be employed.

The method may then depend on the occurrence of a positive (or negative) edge of the synchronized slow clock (block 405). When no positive edge of the synchronized slow clock has been detected, the method continues as described above from block 404. When a positive edge of the synchronized slow clock is detected, sampled data 311 may then be captured (block 406). In various embodiments, positive edge detection circuit 305 may generate enable signal 314 to enable flip-flop 306 to capture sampled data 311 dependent upon fast clock 309. As described above, although only one sample data bit is depicted as being captured by flip-flop 306, in other embodiments, any suitable number of flip-flops may be employed to capture additional sampled slow data bits. Data captured by flip-flop 306, may then be sent to other logic circuit operating in the fast clock domain, at which point, the method may conclude in block 407.

It is noted that the method depicted in FIG. 4 is merely an example. In other embodiments, different operations and different orders of operations are possible and contemplated.

Figure 5:
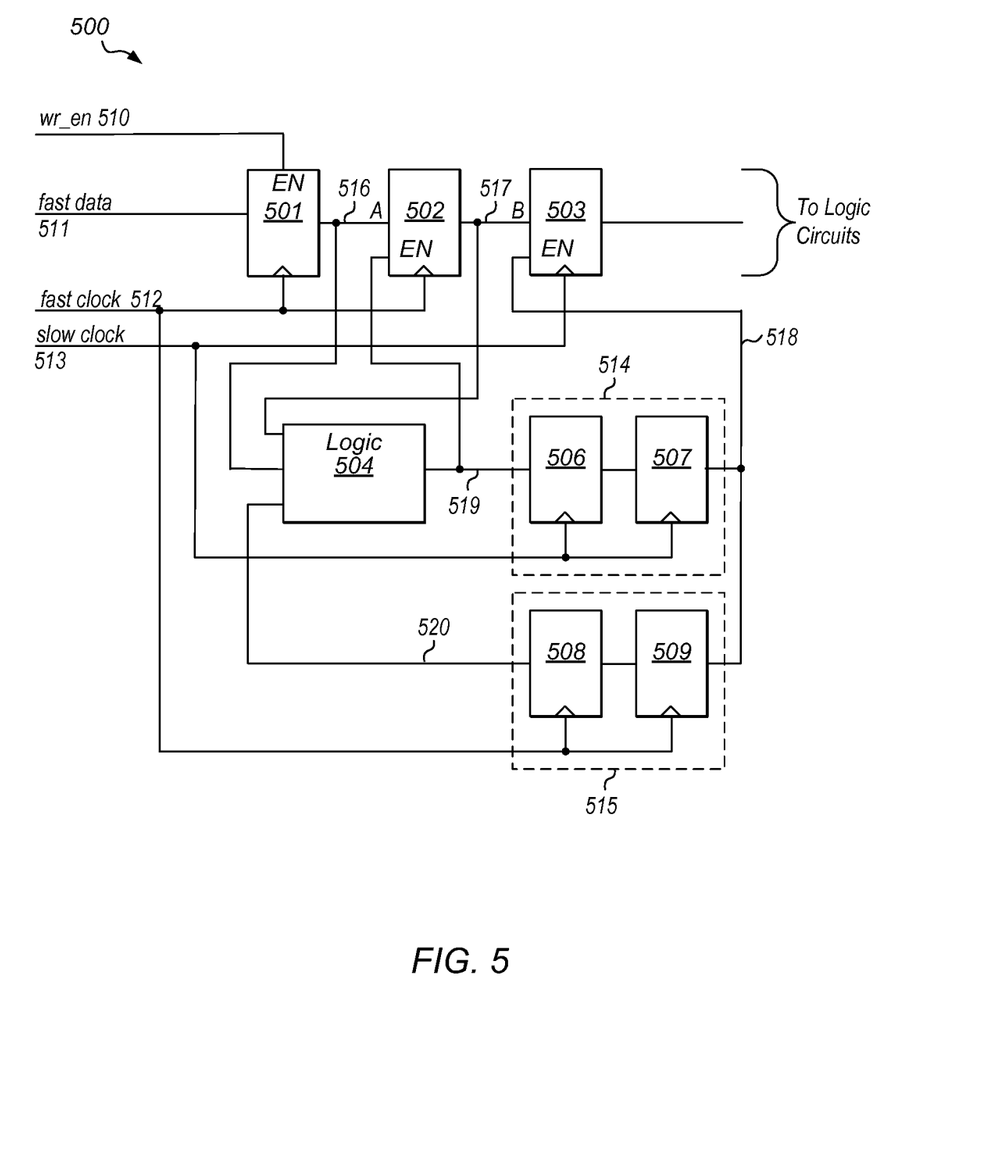
FIG. 5 is a block diagram of an embodiment of another synchronization unit.

Another embodiment of a synchronization unit is illustrated in FIG. 5. In the illustrated embodiment, synchronizer unit 500 includes flip-flop circuits 501, 502, and 503, synchronizer circuits 514 and 515, and logic circuit 504. Synchronization unit 500 may, in various embodiments, be suitable for synchronizing data from a fast clock domain to a slow clock domain.

Flip-flop 501 may be configured to, when write enable signal (wr_en) 510 is asserted, sample fast data 511 dependent upon fast clock 512 to generate signal A 516. In various embodiments, wr_en 510 may be generated by logic circuits in the fast clock domain. It is noted that although fast data 511 is depicted as a single data bit, through the use of additional flip-flops configured in a similar manner to flip-flop 501, additional data bits from the fast clock domain may be sampled.

Flip-flop 502 may be configured to, when signal 519 is asserted, sample signal A 516 dependent upon fast clock 512 to generate signal B 517. In a similar fashion, flip-flop 503 may be configured to, when signal 518 is enabled, sample signal B 517 dependent upon slow clock 513. The output of flip-flop 503 may be coupled to other logic circuits within the slow clock domain.

Synchronizer circuit 514 may, in various embodiments, include flip-flop circuits 506 and 507. Flip-flop circuits 506 and 507 may be coupled in a serial fashion, and each of flip-flop circuits 506 and 507 may be clocked by slow clock 513. Flip-flop 506 may sample signal 519 dependent upon slow clock 513, and flip-flop 507 may sample the output of flip-flop 506 dependent upon slow clock 513 to generate signal 518, which may, in various embodiments, enable flip-flop 503.

In various embodiments, synchronizer circuit 515 may include flip-flop circuits 508 and 509. Flip-flop 509 may sample signal 518 dependent upon fast clock 512. The output of flip-flop 509 may, in turn, be sampled by flip-flop 508 dependent upon fast clock 512 to generate signal 520. In some embodiments, signal 520 may correspond to a condition in which a reset of synchronization unit 500 may be pending.

Logic circuit 504 may, in some embodiments, include any suitable combination of logic gates configured to generate signal 519. In various embodiments, signal 519 may be asserted when signal A 516 is not equal to signal B 518 and reset of synchronization unit 500 is not pending. Logic circuit 504 may, in various embodiments, include additional flip-flop or latch circuits, and may include a dedicated finite state machine (FSM).

It is noted that other embodiments may include other combinations of components, including subsets or supersets of the components shown in FIG. 5 and/or other components.

Figure 6:
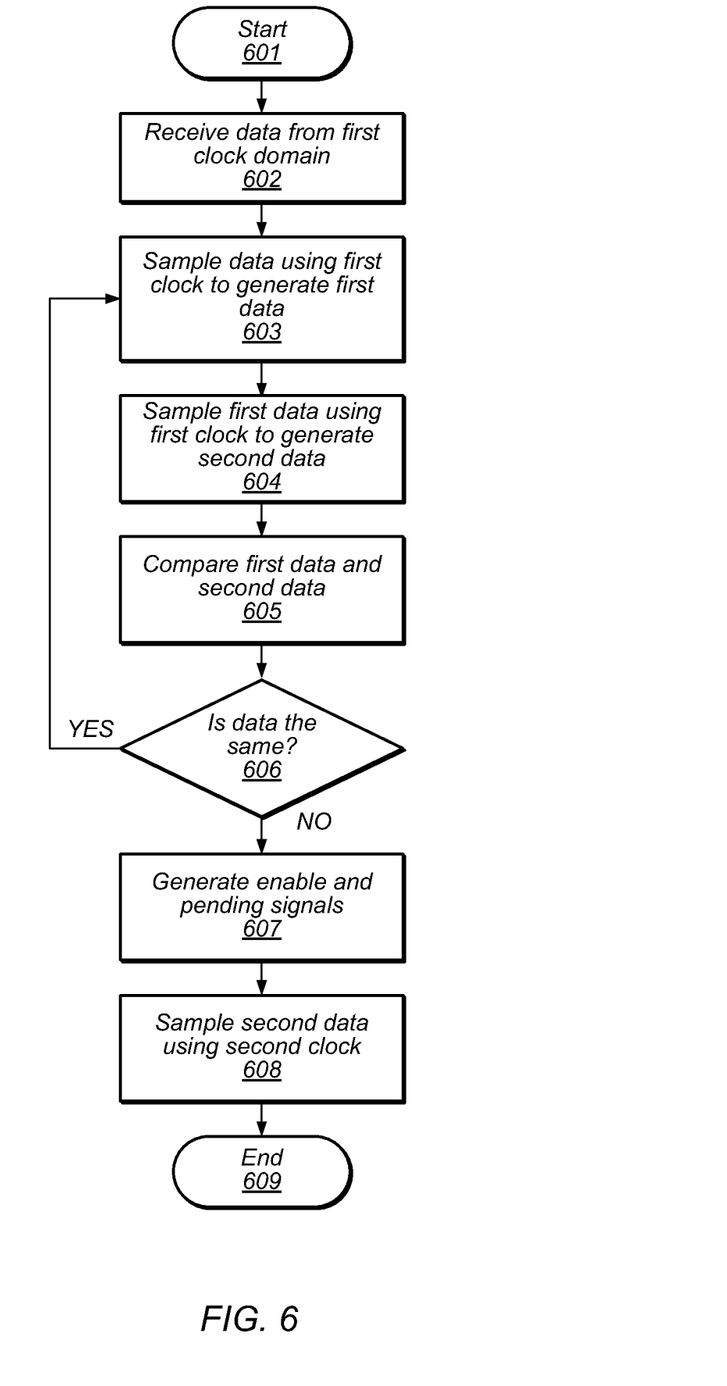
FIG. 6 illustrates a flow diagram of an embodiment of another method of synchronizing a data transfer between clock domains.

Turning to FIG. 6, a flow diagram depicting an embodiment of another method for synchronizing data between two clock domains is illustrated. Referring collectively to the embodiment illustrated in FIG. 5, and the flow diagram depicted in FIG. 6, the method begins in block 601. Data may then be received at the input to flip-flop 501 from logic circuits within a fast clock domain (block 602). It is noted that although only a single data bit is depicted in FIG. 5, any suitable number of data bits may be employed.

Flip-flop 501 may then sample fast data 511 dependent upon fast clock 512 to generate signal A 516 (block 603). In various embodiments, flip-flop 501 may be enabled when wr_en 510 is asserted by logic circuits in the fast clock domain. When wr_en 510 is de-asserted, flip-flop 501 may not sample fast data 511. In various embodiments, wr_en 510 may be asserted responsive to the execution of one or more software commands that signal data needs to be transferred, i.e., written to a different functional block included in a slow clock domain.

Once fast data 511 has been sampled by flip-flop 501, flip-flop 502 may then sample signal A 516 dependent upon slow clock 513 to generate signal B 517 (block 604). In various embodiments, flip-flop 502 may be enabled by signal 519. In various embodiments, signal 519 may be dependent values of signal A 516 and signal B 517 as well as a determination that a reset of synchronization unit 500 is not pending.

Logic circuit 504 may then compare signals A 516 and B 517 (block 605). In various embodiments, logic circuit 504 may include any suitable combination of logic gates necessary to compare signals A 516 and B 517. In cases where the synchronization circuit is used with multiple data bits, logic circuit 504 may perform a bitwise comparison between signals A 516 and B 517.

The method may then depend on the results of the aforementioned comparison (block 606). In some embodiments, when a value of signal A 516 is the same as a value of signal B 517, then the method may proceed from block 603 as described above. When the value of signal A 516 is not the same as the value of signal B 517, then logic circuit 504 in conjunction with synchronizer circuit 514 may generate signal 518 (block 607). In various embodiments, signal 518 may enable flip-flop 503. The value of signal 518 may be synchronized to fast clock 512 by synchronizer circuit 515. The resultant synchronized version of signal 518 may be used by logic circuit 504 in the generation of signal 519.

Once signal 518 has been asserted, flip-flop 503 may then sample signal B 517 (block 608). In various embodiments, the output of flip-flop 503 may be coupled to logic circuits (not shown) within the slow clock domain. With the sampling of signal B 517, the method may then conclude in block 609.

The operations illustrated in the flow diagram of FIG. 6 are depicted as being performed in a serial fashion. In other embodiments, one or more of the illustrated operations may be performed in parallel. For example, signals 518 and 520 may be generated in parallel with the operation of one or more of flip-flop circuits 501, 502, and 503.

Figure 7:
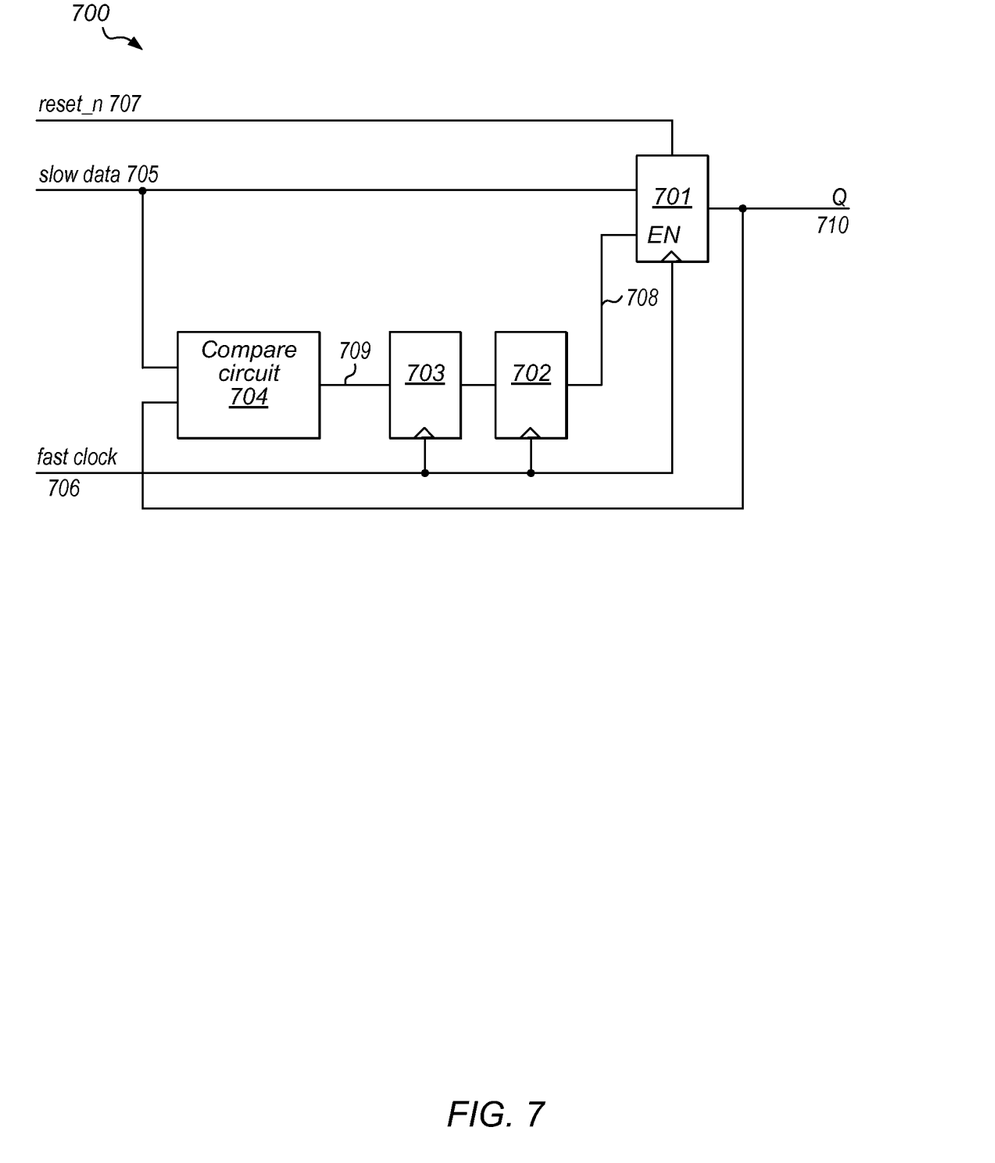
FIG. 7 is a block diagram of an embodiment of a further synchronization unit.

A further embodiment of a synchronization unit is illustrated in FIG. 7. In the illustrated embodiment, synchronization unit 700 includes flip-flop 701, flip-flop 702, flip-flop 703, and comparison circuit 704. Synchronization unit 700 may, in various embodiments, be suitable for synchronizing data from a slow clock domain to a fast clock domain.

Flip-flop 701 may be configured to sample slow data 705 dependent upon fast clock 706 and load enable 708. In various embodiments, slow data 705 may be from a clock domain employing a clock with a lower frequency than fast clock 706. The sampled slow data may be provided to signal Q 710 for use by other logic circuits within the fast clock domain. In various embodiments, flip-flop 701 may be reset dependent upon signal reset_n 707 and enabled dependent upon load enable 708.

Comparison circuit 704 may, in various embodiments, be configured to compare slow data 705 to the output of flip-flop 701, namely signal Q 710. In embodiments, where slow data 705 includes multiple data bits, comparison circuit 704 may be configured to perform a bitwise comparison between the multiple data bits of slow data 705 and signal Q 710. During operation, when a value of slow data 705 is not equal to a value of signal Q 710, comparison circuit 704 may assert an output signal 709.

Load enable 708 may be generated by the combination of flip-flops 702 and 703. Flip-flop 703 may, in various embodiments, sample signal 709, which is output from comparison circuit 704 dependent upon fast clock 706. Flip-flop 702 may, in turn, sample an output of flip-flop 703 dependent upon fast clock 706 to generate signal 708. In various embodiments, the use of flip-flops 702 and 703 may create an signal that may be used to enable flip-flop 701 at periods of time when slow data 705 has changed, and needs to be captured by flip-flop 701 using fast clock 706.

It is noted that the embodiment illustrated in FIG. 7 is merely an example. In other embodiments, different components, different number of components, and different configurations of components are possible and contemplated.

Figure 8:
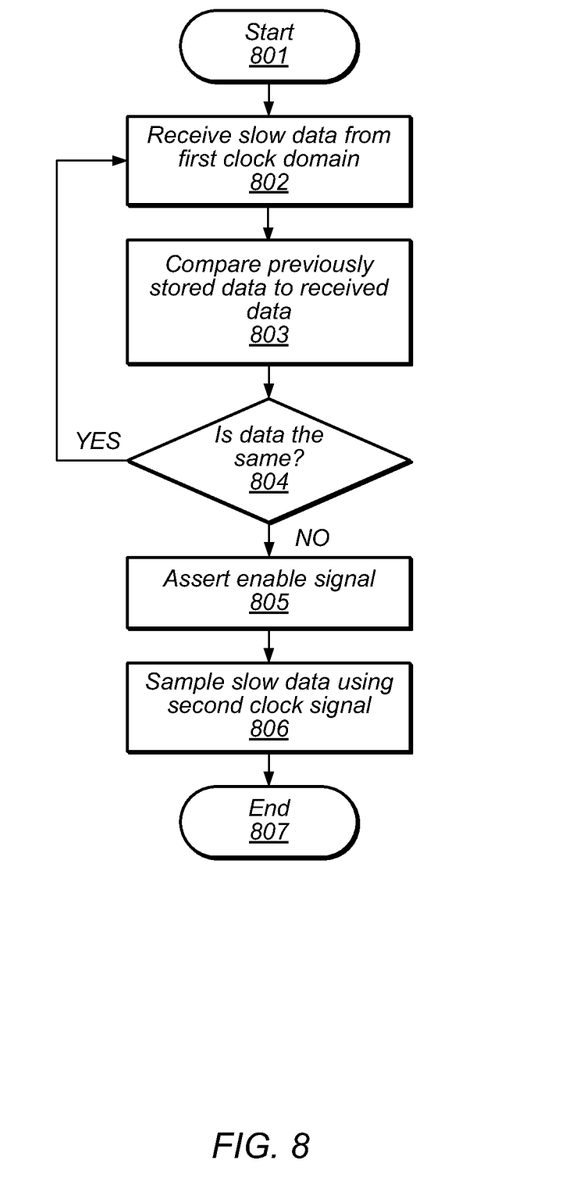
FIG. 8 illustrates a flow diagram of an embodiment of a further method for synchronizing a data transfer between clock domains.

Turning to FIG. 8, a flow diagram depicting an embodiment of a further method of synchronizing data between different clock domains is illustrated. Referring collectively to synchronizer unit 700 as illustrated in FIG. 7, and the flow diagram depicted in FIG. 8, the method begins in block 801. Data may then be received from a first clock domain (block 802). In some embodiments, the first clock domain may be operating at a frequency lower than a destination clock domain.

Comparison circuit 704 may then compare the newly received data with data previously sampled by flip-flop 701 (block 803). In various embodiments, the comparison may include a bitwise comparison of the respective individual bits of slow data 705 and signal Q 710. The method may then depend on the result of the comparison (block 804). When the newly received data and the previously sampled data are the same, the method may proceed from block 802 as described above. If, however, the newly received data is not equal to the previously sampled data, enable signal 708 is asserted (block 805). In some embodiments, the output of comparison circuit 704 is clocked through one or more flip-flop circuits, such as, e.g., flip-flops 702 and 703, using fast clock 706 in order to synchronize the output of comparison circuit 704 with transitions of fast clock 706.

Once enable signal 708 is asserted, slow data 705 may then be sampled by flip-flop 701 (block 806). In some embodiments, slow data 705 may be sampled dependent upon fast clock 706. Once the newly received data has been capture by flip-flop 701, comparison circuit 704 may de-assert signal 709 indicating that the stored data now matches the received data. The transition on signal 709 may then be clocked through flip-flops 702 and 703 dependent upon fast clock 706, thereby disabling flip-flop 701. With the newly received data captured by flip-flop 701, the method may conclude in block 807.

It is noted that the embodiment illustrated in the flow diagram of FIG. 8 is merely an example. In other embodiments, different operations and different orders of operations may be employed.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a first flip-flop circuit configured to sample data dependent upon a first clock signal to generate sampled data;
a synchronizer circuit configured to generate a synchronized first clock signal dependent upon a second clock signal, wherein at least one transition of the synchronized first clock signal corresponds to a transition of the second clock signal, wherein a frequency of the first clock signal is lower than a frequency of the second clock signal;
an edge detection circuit configured to:
detect an edge of the synchronized first clock signal; and
assert an enable signal responsive to the detection of the edge of the synchronized first clock signal; and
a second flip-flop circuit configured to capture, in response to the assertion of the enable signal, the sampled data dependent upon the second clock signal;
wherein the synchronizer circuit comprises:
a third flip-flop circuit configured to sample the first clock dependent upon the second clock signal;
a fourth flip-flop circuit configured to sample an output of the third flip-flop circuit dependent upon the second clock signal.

2. The apparatus of claim 1, wherein the edge detection circuit includes one or more delay circuits.

3. The apparatus of claim 1, wherein the first flip-flop circuit comprises a D-type flip-flop circuit.

4. The apparatus of claim 1, wherein the synchronizer circuit further comprises a fifth flip-flop circuit configured to sample an output of the fourth flip-flop circuit dependent upon the second clock signal.

5. The apparatus of claim 4, wherein the edge detection circuit is further configured to detect a positive edge of the synchronized first clock signal dependent upon the output of the fourth flip-flop circuit and the output of the fifth flip-flop circuit.

6. A method, comprising:
receiving data from circuits included in a first clock domain;
sampling the data dependent upon a clock signal included in the first clock domain to generate sampled data;
synchronizing the clock signal included in the first clock domain to generate a synchronized clock signal, wherein at least one transition of the synchronized clock signal corresponds to a transition of a clock signal included in a second clock domain;
wherein a frequency of the clock signal included in the first clock domain is lower than a frequency of the clock signal included in the second clock domain;
detecting an edge of the synchronized clock signal included in the first clock domain;
asserting an enable signal responsive to the detection of the edge of the synchronized clock signal; and capturing, in response to the assertion of the enable signal, the sampled data dependent upon the clock signal included in the second clock domain;

wherein synchronizing the clock signal included in the first clock domain includes:

sampling, using a first flip-flop circuit, the clock signal included in the first clock domain dependent upon the clock signal included in the second clock domain; and sampling, using a second flip-flop circuit, an output of the first flip-flop circuit dependent upon the clock signal included in the second clock domain.

7. The method of claim 6, wherein detecting the edge of the synchronized clock signal comprises delaying the synchronized clock signal.

8. The method of claim 6, wherein sampling the data dependent upon the clock signal included in the first clock domain comprises sampling the data using a third flip-flop circuit, wherein operation of the third flip-flop circuit is dependent upon the clock signal included in the first clock domain.

9. The method of claim 6, wherein capturing, in response to the assertion of the enable signal, the sampled data dependent upon the clock signal included in the second clock domain comprises capturing the sampled data using a third flip-flop circuit, wherein operation of the third flip-flop circuit is dependent upon the enable signal and the clock signal included in the second clock domain.

10. The method of claim 6, wherein synchronizing the clock signal included in the first clock domain comprises sampling, using a third flip-flop circuit, an output of the second flip-flop circuit dependent upon the clock signal included in the second clock domain.

11. A system, comprising:

a first circuit block using a first clock signal; and a second circuit block coupled the first circuit block and using a second clock signal, wherein the a frequency of the first block signal is lower than a frequency of the second clock signal, and wherein the second circuit block includes a synchronization unit configured to:

sample data received from the first circuit block dependent upon a the first clock signal to generate sampled data;

generate a synchronized first clock signal dependent upon the second clock signal, wherein at least one transition of the synchronized first clock signal corresponds to a transition of the second clock signal;

detect an edge of the synchronized first clock signal; and assert an enable signal in response to the detection of the edge of the synchronized first clock signal; and capture, in response to the assertion of the enable signal, the sampled data dependent upon the second clock signal;

wherein to generate the synchronized first clock signal, the synchronization unit is further configured to:

sample the first clock dependent upon the second clock signal to generate a sampled first clock; and capture the sampled first clock dependent upon the second clock signal.

12. The system of claim 11, wherein to detect the edge of the synchronized first clock signal, the synchronization unit is further configured to delay the synchronized first clock signal.

13. The system of claim 11, wherein to sample the data received from the first circuit block, the synchronization unit is further configured to sample the data using a flip-flop circuit, wherein operation of the flip-flop circuit is dependent upon the first clock signal.

14. The system of claim 11, wherein to capture, in response to the assertion of the enable signal, the sampled data dependent the synchronization unit is further configured to capture the sampled data using a flip-flop circuit, wherein operation of the flip-flop circuit is dependent upon the enable signal and the second clock signal.

15. The system of claim 11, wherein the synchronization unit is further configured to capture the sampled first clock dependent upon the second clock signal to generate a captured clock signal.

16. The system of claim 15, wherein to generate the synchronized first clock signal, the synchronization unit is further configured to sample the captured clock signal dependent upon the second clock signal.

* * * * *